(12) United States Patent
Schulman et al.

(10) Patent No.: US 6,812,070 B2
(45) Date of Patent: Nov. 2, 2004

(54) EPITAXIALLY-GROWN BACKWARD DIODE

(75) Inventors: Joel N. Schulman, Malibu, CA (US); David H. Chow, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/339,174

(22) Filed: Jan. 8, 2003

(65) Prior Publication Data

US 2003/0224549 A1 Dec. 4, 2003

Related U.S. Application Data

(62) Division of application No. 09/398,393, filed on Sep. 17, 1999, now Pat. No. 6,507,043.

(51) Int. Cl.$^7$ .............................................. H01L 21/332
(52) U.S. Cl. ........................ 438/133; 438/136; 438/137; 438/572; 438/604
(58) Field of Search ................................ 438/133, 136, 438/137, 572, 604; 257/46, 104, 105, 106

(56) References Cited

U.S. PATENT DOCUMENTS

| | | | |
|---|---|---|---|
| 5,093,692 A | 3/1992 | Su et al. | |
| 5,556,462 A | 9/1996 | Celii et al. | |

FOREIGN PATENT DOCUMENTS

| | | | |
|---|---|---|---|
| JP | 3-280581 | 12/1991 | |
| JP | 9-55522 | * 2/1997 | ............ H01L/31/04 |

OTHER PUBLICATIONS

B.SU, V J. Goldman, and J.E. Cunningham, "Single–electron tunneling in nanometer–scale double–barrier heterostructure devices," Physical Review B. vol. 46, No. 12, Sep. 15, 1992.

K. Nomoto, K. Taira, T. Suzuki, I. Hase, H. Hiroshima, and M. Komuro, "Diameter dependence of current–voltage characteristics of ultrasmall area AlSb–InAs resonant tunneling diodes with diameters down to 20 nm," Appl. Phys. Lett. 70(15), Apr. 14, 1997.

T. Schmidt, M. Tewardt, R.J. Haug, K.V. Klitzing, B. Schonherr, P. Grambow, A. Forster, and H. Luti, "Peak–to–valley ratio of small resonant–tunneling diodes with various barrier–thickness asymmetries" Appl. Phys. Lett. 68(6), Feb. 5, 1996.

M. Reddy, M.J. Muller, M.J.W. Rodwell, S.C. Martin, R.E. Muller, R.P. Smith, D.H. Chow, and J.N. Schulman, "Fabrication and dc, microwave characteristics of submicron Schuttky–collector AlAs/In$_{0.53}$Ga$_{0.47}$As/InP resonant tunneling diodes," J. Appl. Phys. 77(9), May 1, 1995.

C.A. Burrus, Jr., Backward Diodes for Low–Level Millimeter–Wave Detection, IEEE Transactions on microwave theory and techniques, p. 357, Sep. 1963.

T.A. Richard, E.I. Chen, A.R. Sugg, G.E. Hofler, and N. Holonyak, Jr., "High Current Density Carbon–doped Strained–layer GaAs (p$^+$)–InGaAs(n$^+$)–GaAs(n$^+$) p–n Tunnel Diodes", Appl. Phys. Lett. 63(26), Dec. 27, 1993.

W.L. Chen, G.O. Munns, X. Wand and G. I. Haddad, "Co–integration of High Speed Heterojunction Bipolar Transistors (HBTs) and Tunnel Diodes," 1995 IEEE, pp. 465–473.

* cited by examiner

Primary Examiner—Hsien Ming Lee
(74) Attorney, Agent, or Firm—Tope-McKay & Associates

(57) ABSTRACT

A method of epitaxially growing backward diodes and diodes grown by the method are presented herein. More specifically, the invention utilizes epitaxial-growth techniques such as molecular beam epitaxy in order to produce a thin, highly doped layer at the p-n junction in order to steepen the voltage drop at the junction, and thereby increase the electric field. By tailoring the p and n doping levels as well as adjusting the thin, highly doped layer, backward diodes may be consistently produced and may be tailored in a relatively easy and controllable fashion for a variety of applications. The use of the thin, highly doped layer provided by the present invention is discussed particularly in the context of InGaAs backward diode structures, but may be tailored to many diode types.

5 Claims, 6 Drawing Sheets

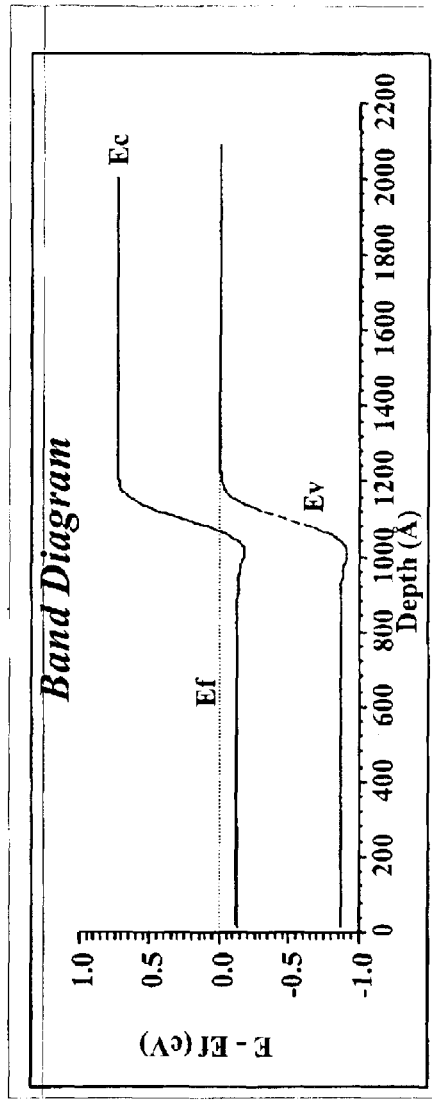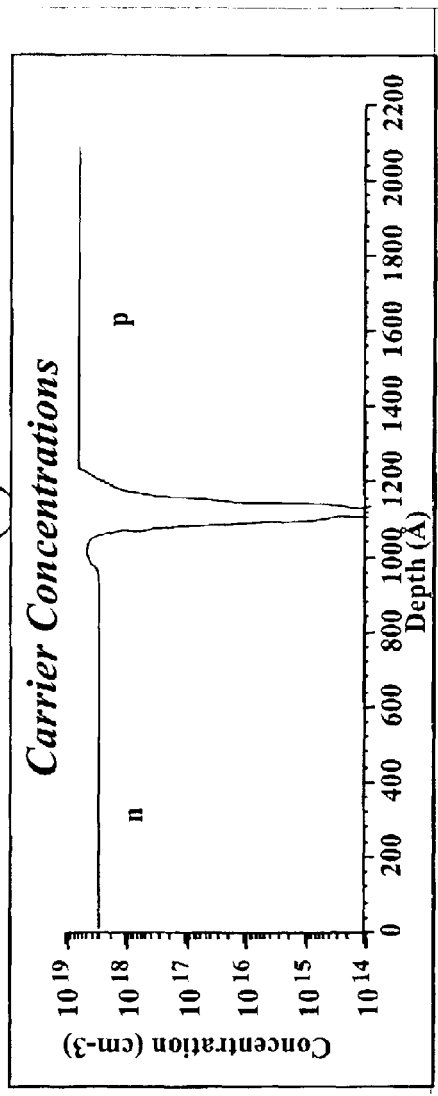
FIG. 3(a) FIG. 3(b)
FIG. 3

| Sample | $V_v$ | $J_p$ | $R_j$ | $\gamma$ | $N_A$ | $N_D$ | d |
|---|---|---|---|---|---|---|---|
| Ge | 0.245 | 172 | 183 | 18 | ? | ? | N/A |
| 2026 | 0.265 | 183 | 155 | 23 | $1 \times 10^{19}$ | $6 \times 10^{18}$ | 100 |
| 2025 | 0.17 | 60 | 614 | 13 | $1 \times 10^{19}$ | $6 \times 10^{18}$ | N/A |
| 2089 | 0.18 | 33 | 655 | 30 | $7 \times 10^{18}$ | $3 \times 10^{18}$ | 100 |

FIG. 6

EPITAXIALLY-GROWN BACKWARD DIODE

PRIORITY CLAIM

This divisional application claims the benefit of priority to U.S. utility application Ser. No. 09/398,393, now U.S. Pat. No. 6,507,043, filed in the United States on Sep. 17, 1999, issued on Jan. 14, 2003, and titled "Epatially-Grown Backward Diode".

TECHNICAL FIELD

The present invention relates to semiconductor devices, and more particularly to backward diodes that may be used for microwave detection and mixing.

BACKGROUND OF THE INVENTION

The tunnel diode is a well-known semiconductor device that conventionally includes two regions of heavily doped semiconductor material of opposite conductivity types separated by a relatively thin junction which permits charge carriers to tunnel through upon the application of a suitable operating potential to the semiconductor regions. The p and n regions of tunnel diodes are so heavily doped that they are degenerate. At equilibrium, a portion of the valence band in the p region of the diode is empty and part of the conduction band in the n region is filled.

Adding a slight back bias brings some filled energy levels of the valence band of the p region to empty energy levels of the conduction band of the n region and, consequently, electrons will flow from the p region to the n region by the quantum-mechanical tunnel effect. Because the number of available valence band energy levels increases with back bias, and since the distance over which the electrons must tunnel decreases with increasing back bias, the back current increases very rapidly with increasing back bias. This is known as the Zener effect. Since the direction of current flow is when the electrons flow from the n region to the p region, the above current is negative.

A slight forward bias brings some levels of the filled part of the conduction band of the n region to empty levels of the valence band of the p region. In this situation, quantum-mechanical tunneling allows electrons to flow from the n region to the p region, giving a positive current that first increases with increasing back bias. When the filled part of the conduction band of the n region is maximally aligned with the empty part of the valence band of the p region, the current goes through a maximum. Subsequently, the current decreases with increasing forward bias, and should approach zero if the filled part of the conduction band of the n region lies opposite the energy gap of the p region. When a yet larger forward bias occurs, electrons and holes are injected over the barrier into the p and n regions, respectively, resulting in a rapid increase in current for increasing forward bias. Thus, the current-voltage has a negative conductance part in the forward region of the characteristic.

In practice, the majority of tunnel diodes are manufactured using one of the following techniques: (1) ball alloy, in which a small metal alloy pellet containing a counter-dopant of high solid solubility is alloyed to the surface of a mounted semiconductor substrate (with high doping) in a carefully controlled temperature-time cycle under inert or hydrogen gas, with the desired peak current level obtained by an etching process; (2) pulse bond, in which the contact and the junction are made simultaneously when the junction is pulse-formed between the semiconductor substrate and the metal alloy containing the counter-dopant; or (3) planar processes, in which fabrication consists generally of the use of planar technology including solution growth, diffusion, and controlled alloying.

Tunnel diodes originated with a device commonly known as an "Esaki diode", which was described by Leo Esaki in "New Phenomenon in Narrow Germanium p-n Junctions", Phys. Rev., 199, 603, published in 1958. There he described, while studying the internal field emission in degenerate germanium p-n junctions, an anomalous current-voltage characteristic observed in the forward direction, which amounted to a negative resistance region over part of the forward characteristic. This characteristic was described through the use of a quantum tunneling concept and led the way to many devices based on its concept. The tunneling time is very short, which permits the use of tunnel diodes well into the millimeter-wave region.

If the doping levels of the p and n regions are decreased, the filled portion of the conduction band of the n region and the empty part of the valence band of the p region become narrower. Consequentially, there will be fewer energy levels from which tunneling under a forward bias can occur. Hence, the maximum in the forward current-voltage characteristic becomes lower and lower until it practically disappears at a given doping level. At this point, the rectifying characteristic becomes the opposite of that of a normal diode. Such a diode is therefore is known as a backward diode.

Backward diodes are utilized in applications such as microwave detection and mixing. Their advantages include high speed, linear square law behavior, zero or small required bias, and temperature insensitivity. The standard backward diode is made from a heavily doped Ge p-n homojunction as utilized in Esaki-type diodes. Ge diodes of this type are manufactured utilizing crude alloying and diffusion techniques that are difficult to control. Furthermore, the materials are not sufficiently stable to withstand normal temperatures when attaching to die, and epoxying is required. Therefore, it is an object of the present invention to provide a backward diode for which manufacture is easily controllable, which may be attached normally to a die, and which may be used as a more consistently manufacturable replacement for current Ge back diodes.

References that provide further background regarding backward diodes include,

C. A. Burrus, IEEE Transactions on Microwave Theory and Techniques, p. 357, September 1963, describing Ge back diodes and their characteristics as detectors;

T. A. Richard, E. I. Chen, A. R. Sugg, G. E. Hofler, and N. Holonyak, Applied Physics Letters 63, p. 3613 (1993), describing GaAs backward diodes with a 100 Å $In_{0.1}Ga_{0.9}As$ layer; and W. L. Chen, G. O. Munns, X. Wang, and G. I. Haddad, Proceedings IEEE Cornell Conference, August 1995, p. 465 (1995), describing InGaAs (on InP) uniformly doped (n=p= $5 \times 10^{19}$ cm$^{-3}$) for conventional Esaki tunnel diodes.

SUMMARY OF THE PRESENT INVENTION

The present invention provides a method for epitaxially-growing a backward diode device including the steps of epitaxially growing an n-side including at least one n-doped layer; epitaxially growing a thin, heavily n-doped layer on the n-side; and epitaxially growing a p-side opposite the n-side on the thin, heavily n-doped layer, said p-side including at least one p-doped layer. Furthermore, the method is preferably used when the at least one n-doped layer, the thin, heavily n-doped layer, and the at least one p-doped layer are grown of a semiconductor material, and optimally when the semiconductor material is InGaAs.

BRIEF DESCRIPTION OF THE DRAWINGS

FIG. 3(a) provides a simulated band diagram for an InGaAs diode providing a p-side uniformly doped at $7 \times 10^{18}$ cm$^{-3}$, with a 100 Å layer n-doped to $1 \times 10^{19}$ cm$^{-3}$ inserted at the junction, and wide contact layers with p=$7 \times 10^{18}$, n=$3 \times 10^{18}$;

FIG. 3 (b) provides a simulated carrier concentration profile for an InGaAs diode providing a p-side uniformly doped at $7 \times 10^{18}$ cm$^{-3}$, with a 100 Å layer n-doped to $1 \times 10^{19}$ cm$^{-3}$ inserted at the junction, and wide contact layers with p=$7 \times 10^{18}$, n=$3 \times 10^{18}$;

FIG. 6 provides tabular data for the test samples of FIG. 5.

DETAILED DESCRIPTION

The present invention relates to backward diodes, as well as to apparatus incorporating them therein. The following description is presented to enable one of ordinary skill in the art to make and use the invention and to incorporate it in the context of particular applications. Various modifications to the preferred aspect, as well as a variety of uses in different applications will be readily apparent to those skilled in the art, and the general principles defined herein may be applied to other aspects. Thus, the present invention is not intended to be limited to the aspects shown, but is to be accorded the widest scope consistent with the principles and novel features disclosed herein.

Figure 1:
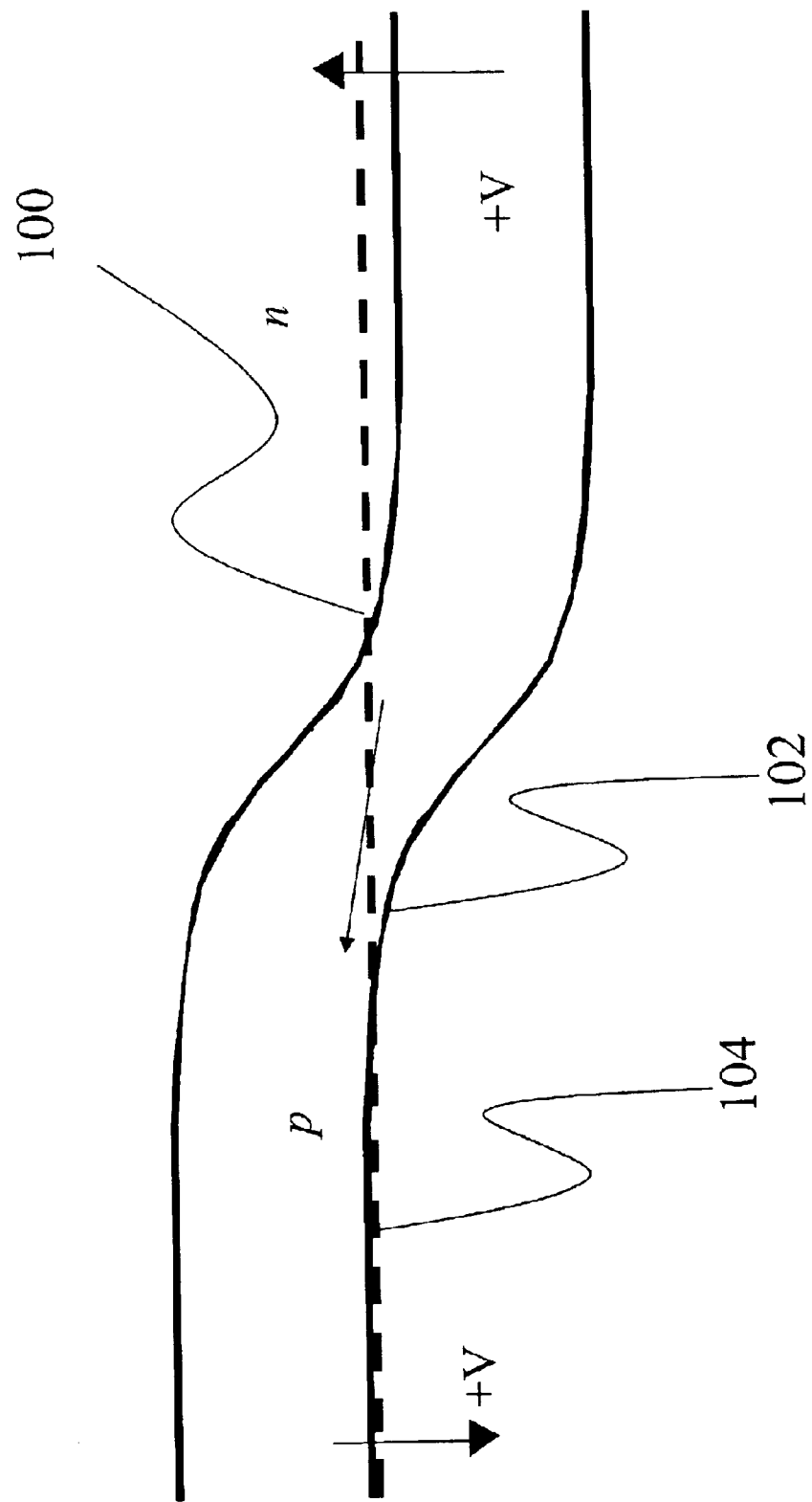
FIG. 1 provides a band diagram for a conventional implementation of a backward Esaki diode.
Figure 2:
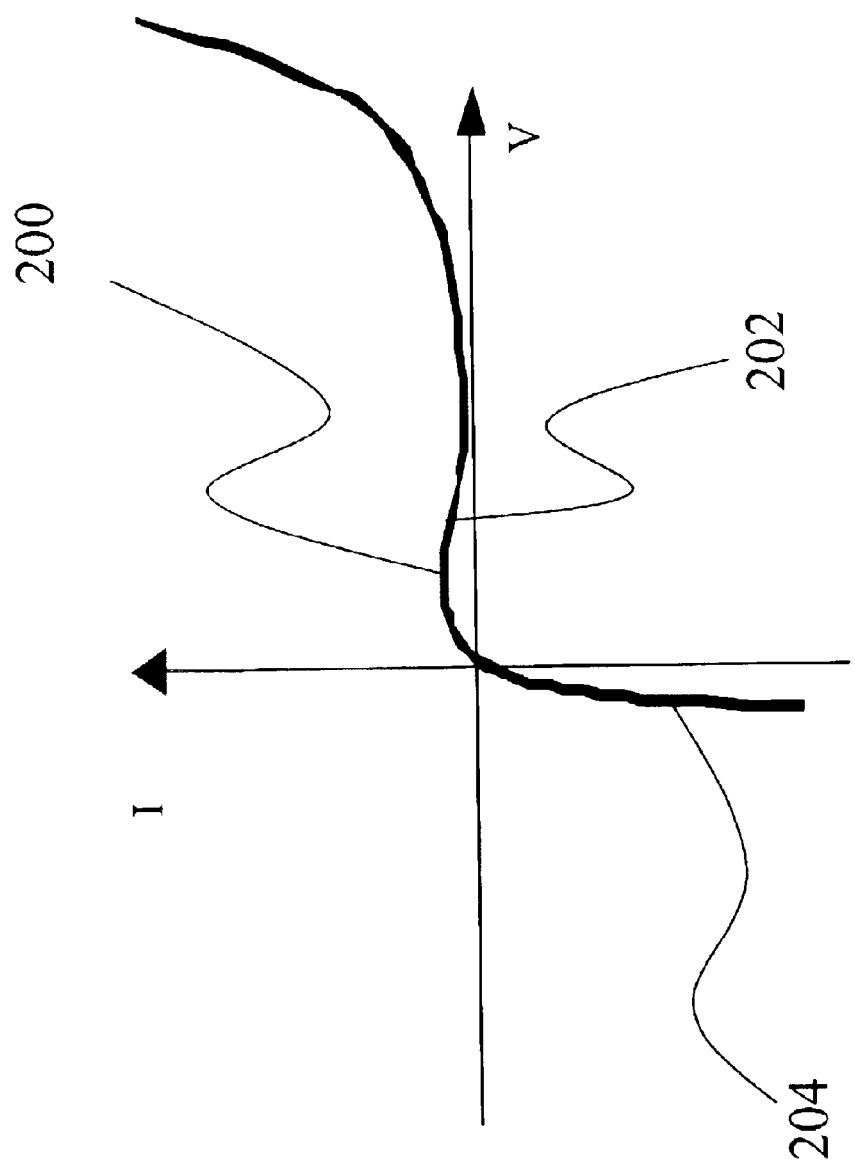
FIG. 2 illustrates a current-voltage (I(V)) curve for a conventional implementation of a backward Esaki diode.

A band diagram of a conventional implementation of a typical backward Esaki diode is shown in FIG. 1 and its current-voltage I(V) curve is shown in FIG. 2. The backward Esaki diode includes a conventional heavily doped p-n junction of Ge or other semiconductor. The heavy doping bends the valence bands 100 and 102 sufficiently to allow electrons in the n-doped side to tunnel through the relatively thin band-bending region into the p-doped side. If the doping is very heavy on both sides, a negative resistance peak 200 in the I/V curve is produced for positive bias as the electrons tunnel from the n-doped side to the holes in the p-doped side. The vertical arrows in FIG. 1 indicate the direction of the shift of valence band edges 100 and 102 with positive bias. For sufficient positive bias the electron energies are too high for tunneling into the hole states, and negative differential resistance results, as demonstrated by the downward slope 202 with increasing voltage in FIG. 2. For negative bias, if the doping is high, the band-bending region is short, and electrons from the p-doped side at energies below the Fermi level 104 can tunnel from left to right into the n-doped side. This current can be large and increases exponentially with reverse bias, as demonstrated by the I(V) curve to the left of the origin 204 in FIG. 2.

If the p-type doping is not too large, the Fermi level 104, in FIG. 1, will be close to the valence band edge on the p-type side 102. In this situation, there are relatively few hole states for the electrons to tunnel into with forward bias. The peak current of the negative resistance I(V) will be small, while the tunneling current in the negative bias direction 204 is relatively unaffected and large, as shown in FIG. 2. The desirable characteristic is the highly non-linear I(V) near zero bias, represented by the origin in the I(V) curve shown in FIG. 2. This characteristic makes the backward diode an extremely useful device for mixing and detecting of RF signals.

Ge diodes have become established as the most useful semiconductor choice for backward diodes. This is mainly due to the band gap, about 0.67 eV, at room temperature, which is small enough so that the amount of tunneling is large for small negative bias. At the same time it is large enough to block normal p-n diode-type thermally activated tunneling over the built-in junction voltage for small positive bias. Thus the desirable characteristic of large backward current and small forward current for small bias is achieved.

Ge is rarely grown with modern epitaxial growth technology such as molecular beam epitaxy (MBE) due to the rarity of other Ge semiconductor device applications. InGaAs in particular, by contrast, has increasing application for type III–V semiconductor circuits and InGaAs epitaxial growth facilities are easily accessible. InGaAs grown with lattice match to InP is a natural substitute for Ge, as it has a small room temperature band gap of 0.75 eV. Attempts have been made to grow heavily doped p-n junctions of InGaAs in order to duplicate the I(V) of a comparison Ge diode. Although backward diodes were easily achievable, initial results were not as good as the comparison Ge diode. Either high backward currents or low forward currents could be achieved depending on the particular sample, but not both in the same sample. This problem is attributable to two features. First, the slightly greater band gap of the InGaAs reduces the backward current compared to Ge. Second, InGaAs is a direct semiconductor, which causes it to have a significantly smaller density-of-states conduction band effective mass than Ge; 0.043 versus 0.22 in units of the free electron mass. This means that for a similar n-type doping, the Fermi level in InGaAs is significantly higher as compared with Ge. This results in an extended positive voltage range in which the tunneling current increases, i.e., a high peak voltage (see FIG. 2), with an undesirable linear I(V) near the origin.

To overcome this limitation, the ability to tailor the InGaAs semiconductor layers on a nanometer scale is required. Control of the p-doped side is not as critical as that of the n-doped side due to the high density-of-states effective mass of holes as compared with conduction electrons, so it may be kept as highly doped and homogeneous. In the present invention, a thin, highly doped region in the n-side near the p-n junction is used to increase the local electric field, while a lower doped region further away keeps the Fermi level adequately low. This significantly enhances the backward tunneling current, while only moderately increasing the undesirable forward current. The highly doped region must be thin enough so that the Fermi level does not re-acquire the value associated with the bulk material with that corresponding doping. FIG. 3(a) and FIG. 3(b) show the results of a simulation of the band profile and carrier concentration profile, respectively, where the p-side is uniform with a doping level of $7 \times 10^{18}$ cm$^{-3}$, a 100 Å layer n-doped to $1 \times 10^{19}$ cm$^{-3}$ is present at the junction, and a wide contact layer n-doped with to a doping level of n=$3 \times 10^{18}$ cm$^{-3}$ produces a sufficiently low Fermi level for the contact layers. The effect of the 100 Å region can be seen in the band profile in that it steepens the voltage drop at the junction and thereby increases the electric field. The Fermi level relative to the conduction band is slightly increased, but not significantly. The plot of the concentration versus distance shows a corresponding increase in the number of conduction electrons in the added thin layer. Conventional diode manufacturing techniques afford insufficient control to produce a consistent thin layer. Therefore, epitaxial-growth techniques such as MBE provide the means for consistent, controlled production of a thin layer.

Figure 4:
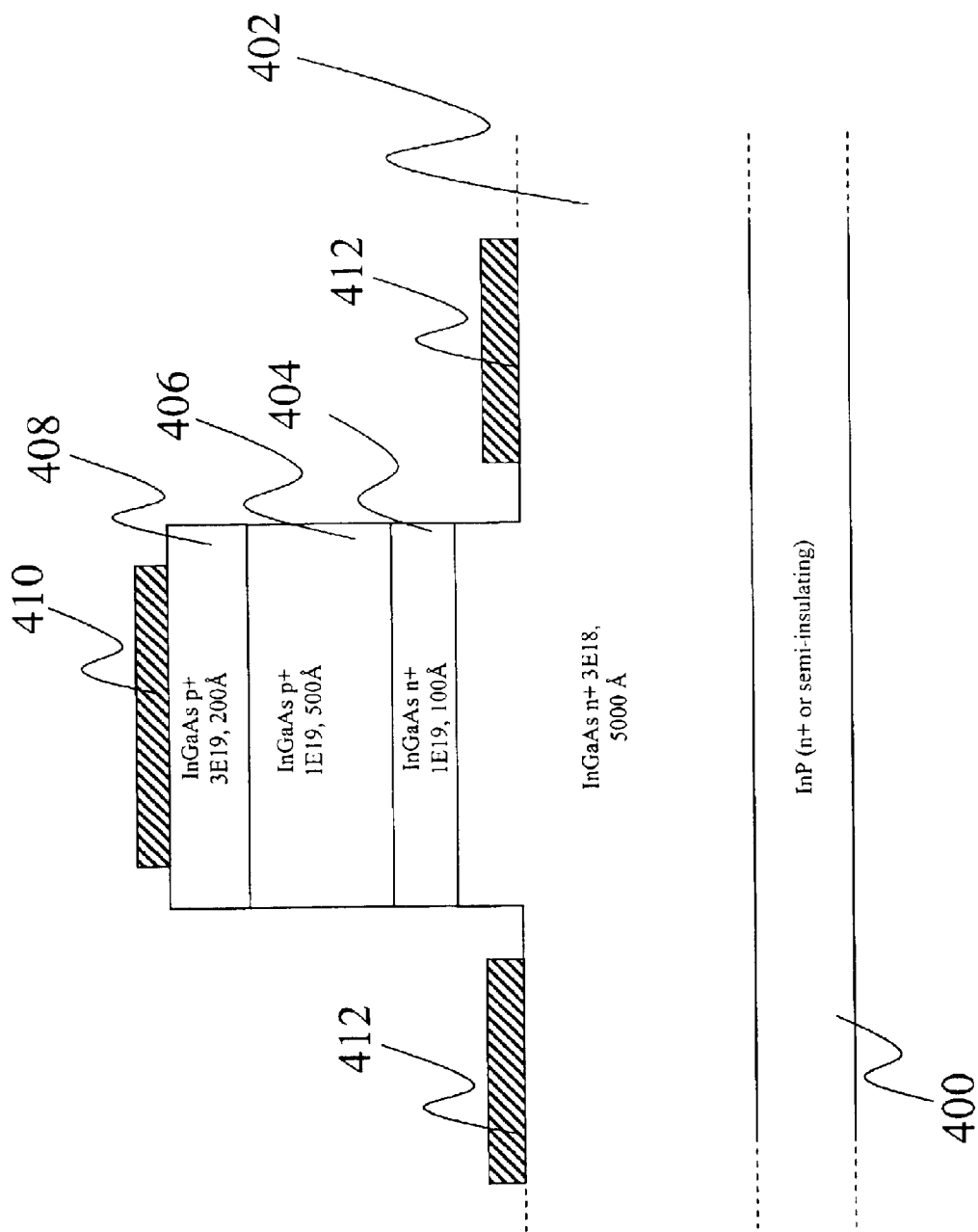
FIG. 4 provides a diagram showing the layer structure of the present invention.

FIG. 4 provides a diagram showing the layer structure of an aspect of the present invention utilizing a thin layer similar to that described relative to FIG. 3(a) and FIG. 3(b). As can be seen from the diagram, the fabrication begins with a substrate 400 of InP n+ or other semi-insulating material having a thickness that may be chosen suitable to the particular application. Next, a first InGaAs layer 402 is deposited and n+ doped to generally between $1 \times 10^{18}$ to $1 \times 10^{19}$ cm$^{-3}$, typically $3 \times 10^{18}$ cm$^-$. The thickness of the first InGaAs layer is shown in the figure as typically about 5000 Å. Subsequently, a second, thin and highly n+ doped InGaAs layer 404 is deposited, with the n+ doping level generally between $3 \times 10^{18}$ and $3 \times 10^{19}$ cm$^{-3}$; typically $1 \times 10^{19}$. It is important that the doping level of the second InGaAs layer is greater than that of the first InGaAs layer. The thickness of the second InGaAs layer is generally between 25 Å and 200 Å, typically 100 Å. Next, a third InGaAs layer 406 is deposited with a p+ doping generally between $5 \times 10^{18}$ and $2 \times 10^{19}$ cm$^{-3}$, and typically $1 \times 10^{19}$ cm$^{-3}$, and with a thickness generally ranging from from 200 Å to over 1000 Å, and typically 500 Å. Subsequently, a fourth InGaAs layer 408 is deposited with a p+ doping generally ranging from $2 \times 10^{19}$ to $5 \times 10^{9}$ cm$^{-3}$, and typically $3 \times 10^{19}$ cm$^{-3}$ and a thickness generally ranging from 100 Å to 1000 Å, and typically 200 Å. Finally, the structure is etched to provide the desired electrical isolation and contact regions, and contacts 410 and 412 are deposited onto the structure. Note that FIG. 4 provides a cutaway view of what typically is formed as a circular mesa-type structure, and that contact 412 would generally be formed as a ring. Utilizing epitaxial-growth techniques such as molecular beam epitaxy (MBE) and metal-organic molecular beam epitaxy (MOMBE) to produce the InGaAs structure of FIG. 4 allows for improved control over the manufacturing process, resulting in a more consistent diode. Without the control afforded by these techniques, tailoring the second InGaAs layer in particular would not be feasible. Thus, it is important that the second InGaAs layer be formed by an epitaxial-growth technique or a method which achieves a similar result. Furthermore, although InGaAs has been chosen for the material structure of this example, there are other material structures to which it could apply.

Figure 5:
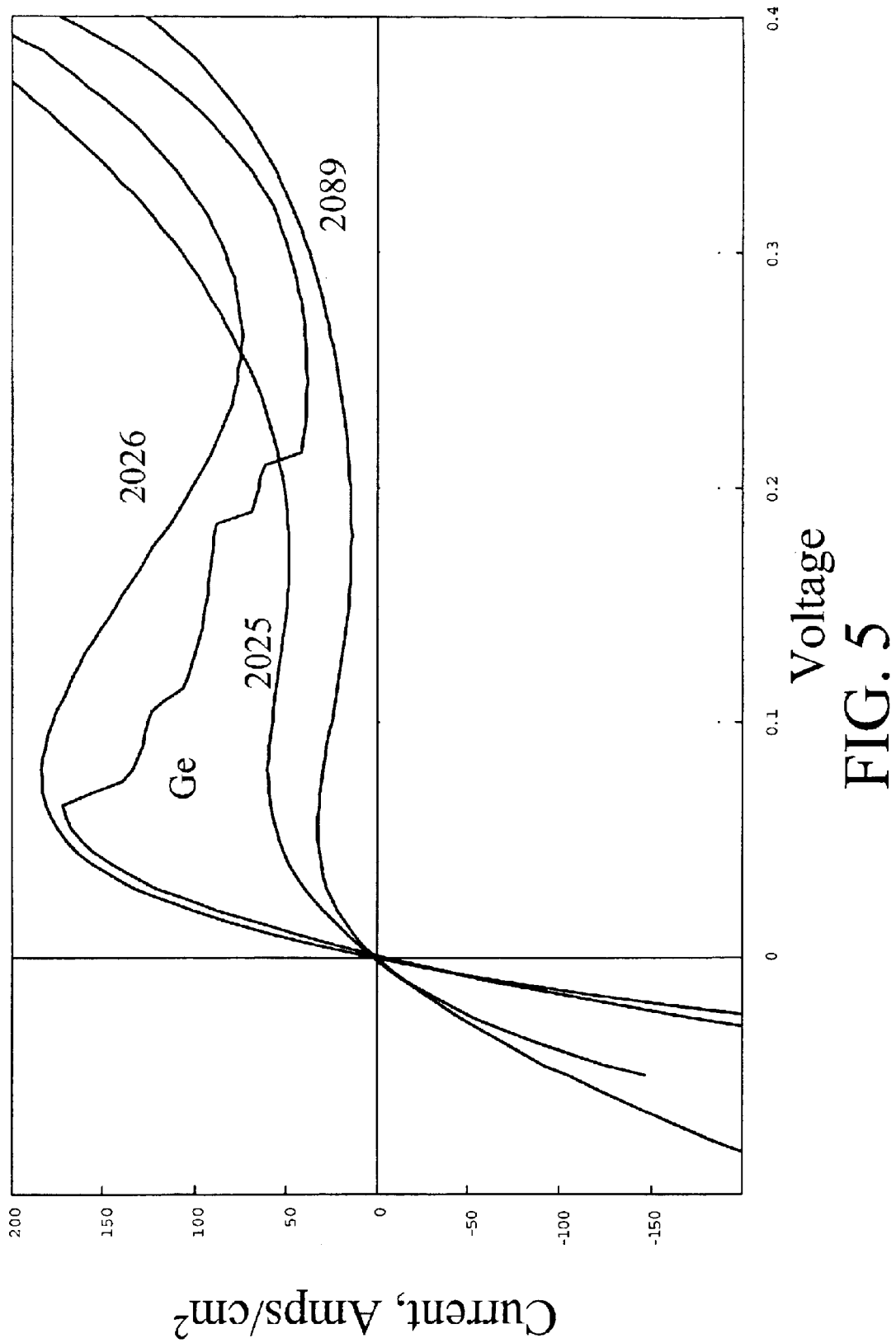
FIG. 5 provides current-voltage (I(V)) curves for several test samples of the present invention and for a conventional Ge structure.

FIGS. 5 and 6 provide measurements from samples including three InGaAs fabricated diodes and a Ge diode. FIG. 5 provides current-voltage curves generated for each of the samples. FIG. 6 provides pertinent numerical data regarding each of the samples in units contained in the same data as the current-voltage (I(V)) diagram of FIG. 5. In FIG. 6, $V_v$ provides the voltage in volts, V, at the local minimum of the valley toward the right hand side of the figure for each samples, $J_p$ provides the current in Amps/cm$^2$ at the local maximum of the current peak located near the middle of the chart for each of the samples, $R_j$ provides the resistance in ohms, $\Omega$, at zero bias, and $\gamma$ is the curvature coefficient, where $$\gamma = \frac{\frac{\partial^2 I}{\partial V^2}}{\frac{\partial I}{\partial V}}$$

The last column in FIG. 6, labeled d provides the thickness, in angstroms, Å, of a thin InGaAs layer with a doping level of $1 \times 10^{19}$ cm$^{-3}$ corresponding to the InGaAs layer 304 of FIG. 3. Of the samples, a conventional diode, 2025, was fabricated without the thin InGaAs layer, providing a curvature coefficient $\gamma$ of approximately 13 and a low current density of 60, resulting in a relatively slow operational speed. The best diode with the thin InGaAs layer was 2026, which had a higher current density $J_p$ and a lower curvature $\gamma$ than 2089, demonstrating the ability to trade off desirable features. Sample 2026 also provided a lower resistance $R_j$ of approximately 155 $\Omega$. It is important to note that these samples are provided merely for illustrative purpose and not to infer any limitations to the present invention.

A figure of particular importance for the voltage sensitivity of square law power measurement applications is $\gamma$, the I(V) curvature divided by the slope. Values comparable to the Ge diode were obtained. Without the extra thin layer, $\gamma$ was limited to less than 20. Thus, the InGaAs diode of the present invention which provides a controllable profile designed to maximize curvature near the origin of the I(V) curve is useful for many applications, especially those requiring highly specific characteristics such as detectors.

What is claimed is:

1. A method for epitaxially-growing a backward diode including the steps of:

growing an n-side including at least one n-doped InGaAs layer;

growing a thin, heavily n-doped InGaAs layer on the n-side; and growing a p-side opposite the n-side on the thin, heavily n-doped InGaAs layer, said p-side including at least one p-doped InGaAs layer.

2. A method for epitaxially-growing a backward diode as set forth in claim 1 further including the step of:

forming electrical contacts on the n-side and p side.

3. A method for epitaxially-growing a backward diode as set forth in claim 2, wherein the step of growing a thin, heavily n-doped InGaAs layer on the n-side includes the following steps:

growing a thin layer on the n-side to a depth of approximately between 25 and 200 Å; and doping the thin layer on the n-side to a concentration approximately between $3 \times 10^{18}$ and $3 \times 10^{19}$/cm$^3$ such that the doping concentration of the thin layer is greater than that of the most proximate one of the at least one n-doped InGaAs layer of the n-side.

4. An epitaxially-grown backward diode fabricated according to the method of claim 2.

5. An epitaxially-grown backward diode fabricated according to the method of claim 1.

* * * * *

UNITED STATES PATENT AND TRADEMARK OFFICE
CERTIFICATE OF CORRECTION

PATENT NO. : 6,812,070 B2 Page 1 of 1
APPLICATION NO. : 10/339174
DATED : November 2, 2004
INVENTOR(S) : Joel N. Schulman and David H. Chow It is certified that error appears in the above-identified patent and that said Letters Patent is hereby corrected as shown below:

Column 1, line 10, insert the following text:

--STATEMENT OF GOVERNMENT INTEREST

This invention was made with U.S. Government support from the Space and Missile Systems Center, Los Angeles Air Force Base, California, under Contract No. F04701-97/C-0028. The U.S. Government may have certain rights in this invention.--

Column 5, line 18, "$3 \times 10^{18}$ cm-" should read --$3 \times 10^{18}$ cm$^{-3}$--.

Signed and Sealed this

Sixth Day of November, 2007

JON W. DUDAS
*Director of the United States Patent and Trademark Office*